United States Patent
Chen

(10) Patent No.: US 7,385,465 B2
(45) Date of Patent: Jun. 10, 2008

(54) SWITCHABLE DUAL-BAND FILTER

(75) Inventor: Cheng-Chung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 230 days.

(21) Appl. No.: 11/305,913

(22) Filed: Dec. 19, 2005

(65) Prior Publication Data

US 2007/0139138 A1   Jun. 21, 2007

(51) Int. Cl.
*H03H 7/01* (2006.01)
(52) U.S. Cl. ......................................... 333/175; 333/32
(58) Field of Classification Search ................ 333/175, 333/32
See application file for complete search history.

(56) References Cited

U.S. PATENT DOCUMENTS

| | | | |
|---|---|---|---|
| 4,571,560 A * | 2/1986 | Dobrovolny | 333/174 |
| 5,065,120 A * | 11/1991 | Munn | 333/207 |
| 5,576,672 A * | 11/1996 | Hirai et al. | 333/204 |
| 5,917,387 A * | 6/1999 | Rice et al. | 333/174 |
| 2004/0246074 A1 * | 12/2004 | Humphrey | 333/174 |
| 2005/0093645 A1 * | 5/2005 | Watanabe et al. | 333/101 |

FOREIGN PATENT DOCUMENTS

JP   2002009573   1/2002

OTHER PUBLICATIONS

IEEE Transactions on Microwave Theory and Techniques, vol. 49, No. 12, Dec. 2001 Tunable Active Filters Having Multilayer Structure Using LTCC Keisuke Kageyama, Member, IEEE, Kohki Saito, Hisanori Murase, Hideki Utaki, and Toshishige Yamamoto, Member, IEEE.

* cited by examiner

*Primary Examiner*—Benny Lee
*Assistant Examiner*—Eric R Hamill

(57) ABSTRACT

A switchable dual-band filter comprises first and second switchable resonators, a coupling structure having two ends respectively connecting the first and the second switchable resonators, an input impedance conversion circuit connecting an input terminal and the first resonator, and an output impedance conversion circuit connecting an output terminal and the second resonator. The coupling structure couples the first resonator to the second resonator, and vice versa. The input/output impedance conversion circuit converts the impedance on the input/output terminal into two distinct impedances that correspond to a first and a second operating frequency. The filter is simple in structure, occupies a smaller circuit area, and is cost-effective in manufacturing. The impedance at both operating passbands can also be matched properly.

13 Claims, 9 Drawing Sheets

SWITCHABLE DUAL-BAND FILTER

FIELD OF THE INVENTION

The present invention generally relates to a radio frequency (RF) filter, and more specifically to a switchable dual-band RF filter.

BACKGROUND OF THE INVENTION

The trend of wireless local area network (WLAN) and mobile communication moves towards the multi-band/multi-modal system integration, for example, the WLAN 802.a, 802.b, 802.g system. The conventional dual-band RF transceiver device usually includes plural independent transceivers, and each independent transceiver is used for the signals with an individual frequency band. In the front end of the RF system, the research in demands aims at integrating RF components operating at different frequency band.

FIG. 1 shows a schematic diagram of a prior-art dual-band RF front end. As shown in FIG. 1, a complete dual-band RF front end 100 includes a bandpass filter (BPF) element 101, a balun element 105, a power amplifier (PA) element 103, and a low-pass filter (LPF) element 107. Each element has two separated components that are included for operating at frequencies 2.4 GHz and 5.0 GHz, respectively. In a highly integrated multi-band/multi-modal RF structure, an RF filter that is switchable between different passbands will play an important role in functional integration and size reduction of RF front-end module.

Several proposals have been made for the implementation of tunable or switchable RF filters. An RF filter with tunable center frequency is usually implemented with a switch to switch among a number of filters, usually referred to as a filter bank. A filter bank includes a plurality of filters that each has a different center frequency. The input end and the output end of each filter are all connected to switches, which are controlled by an external voltage for switching on the filter corresponding to the required operating frequency, and switching off all the other filters. This type of filter allows the user to switch between any passbands, and usually shows good filtering response. However, because each switched passband requires a filter and two switching circuits, this design has the drawbacks of requiring a larger circuit area and more elements. A few developments have been disclosed to address the above drawbacks.

U.S. Pat. No. 4,571,560 disclosed a switched bandpass filter 200 as shown in FIG. 2. The bandpass filter 200 includes a plurality of triple tuned bandpass filter sections 205a-205c coupled in parallel between an input terminal 203 and an output terminal 201. The input terminal 203 is shunted with a pair of series resonant circuit 203a, 203b while the output terminal 201 is shunted with a pair of series resonant circuit 201a and 201b. Each tuned bandpass filter section includes a respective switch in the internal path, as indicated by s1-s3. As shown in FIG. 2, when the switch is switched off, for example switch s1, the filter is not affected. When the switch is on, as switches s2, s3 in FIG. 2, the filter is grounded and the filter is not in effect. This filter reduces the number of required switches. However, as a filter section is required for each passband, this filter still requires a large filter circuitry.

U.S. Pat. No. 5,917,387 disclosed an RF filter, and the RF filter provides a tunable center frequency across a specified frequency by only one or more resonator elements, wherein normalized frequency response of the filter related to the center frequency remains substantially constant over the specified frequency range. FIG. 3 shows a schematic diagram of the filter.

As shown in FIG. 3, the filter includes a varactor diode inside each resonator element of the filter. The varactor diode is an equivalent of a capacitor, whose capacitance depends on the external control voltage. Therefore, the frequency of the resonator element can be changed by changing the external control voltage. This leads to the change of the center frequency of the filter. With this type of varactor diode, a single filter can operate at different passbands. In comparison with the prior design, the above design successfully reduces the circuit area. However, the drawback of this filter is that the tunable range of operating passbands is small.

Another obstacle to overcome for the tunable or switchable filter is the matching between the output/input terminals and a resonator element when the resonance frequency of the resonator element has a drastic change. This is also referred to as external quality factor. The external quality factor also changes when the frequency changes. This causes a major problem as the filter usually fails to have good matching when the two resonance frequencies have a large difference. Japan Patent No. JP2002009573 disclosed a design including a tunable capacitor or a tunable inductor between a resonance circuit and an input terminal or an output terminal to adjust the matching at different frequencies.

SUMMARY OF THE INVENTION

The present invention has been made to overcome the aforementioned drawbacks of a conventional switchable or tunable filter that needs a large circuit area and suffers from the matching problem. The primary object of the present invention is to provide a switchable dual-band filter that uses a smaller circuit area and less components so that the overall size can be reduced.

Another object of the present invention is to provide a switchable dual-band in which the impedance at both operating passbands can also be matched properly. With an impedance conversion circuit, the impedance at the output terminal can be adjusted and matched properly at both operating passbands.

To achieve the above objects, the switchable dual-band filter of present invention comprises a first and a second switchable resonators, a coupling structure having two ends respectively connecting the first and the second switchable resonators, an input impedance conversion circuit connecting an input terminal and the first resonator, and an output impedance conversion circuit connecting an output terminal and the second resonator.

With the control of an external voltage, the filter can switch between the passbands to filter out the other frequencies. The switch is integrated into the resonator of the filter. With the switch being on and off, the resonator resonates at two different frequencies. In addition, a dual-band impedance conversion circuit is placed between the resonator and the input/output terminal, and the impedance for the filters can be matched properly at both passbands. The present invention can be realized with an integrated circuit or a multi-layer circuit board.

In comparison with the conventional switchable dual-band filters, the present invention integrates the switch into the resonator elements of the filter. Unlike the conventional techniques using varactors, the center frequencies of the two passbands are determined by the capacitance ratio of the two passive capacitors of the resonator elements. Therefore, the switchable range of the center frequencies of the passbands is not restricted by the varactor as in the conventional structure of a tunable filter. Furthermore, the dual-band impedance conversion circuit between the resonators and the input/output terminals converts the impedance at the input/output terminals to different values so that the impedance can be matched properly at both operating passbands.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
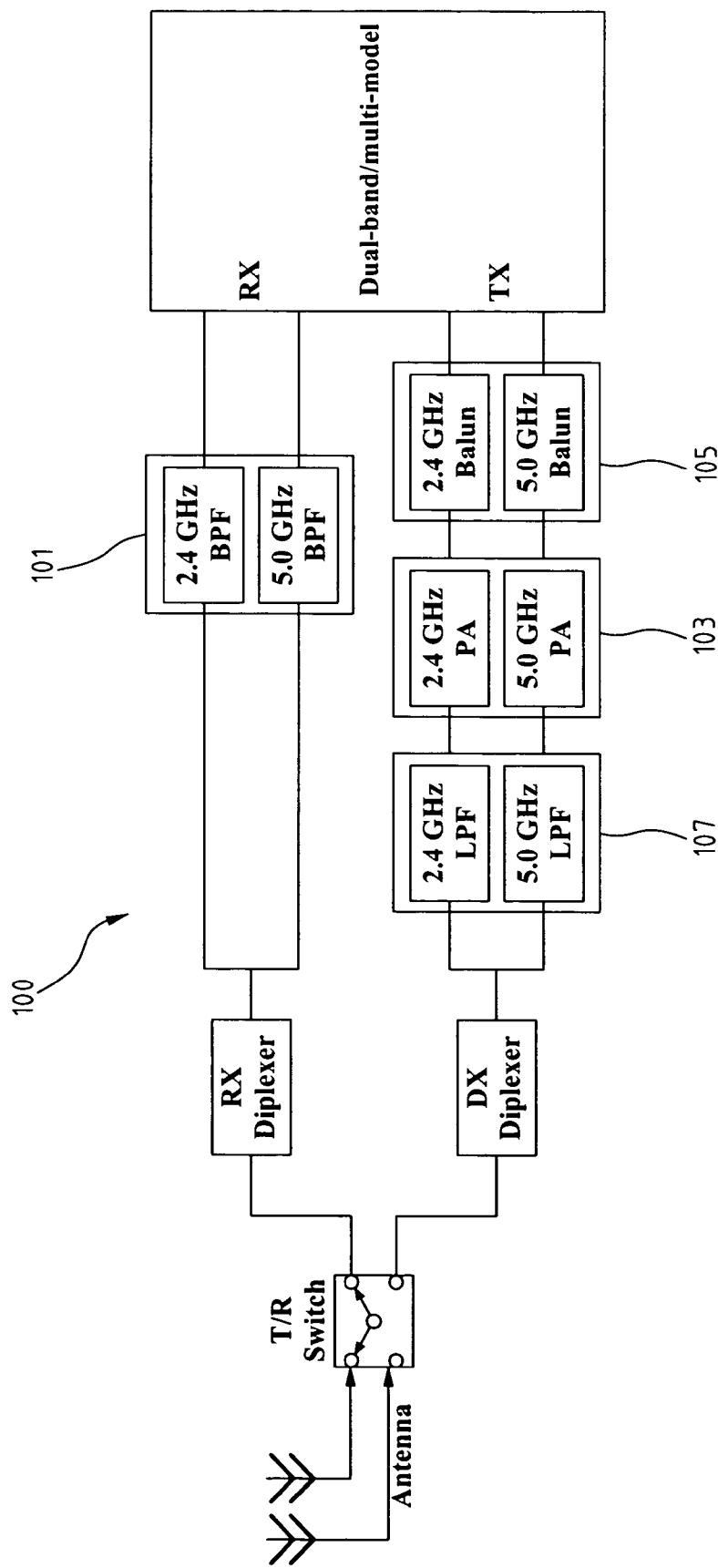
FIG. 1 shows a schematic diagram of a prior-art dual-band RF front-end filter.
Figure 2:
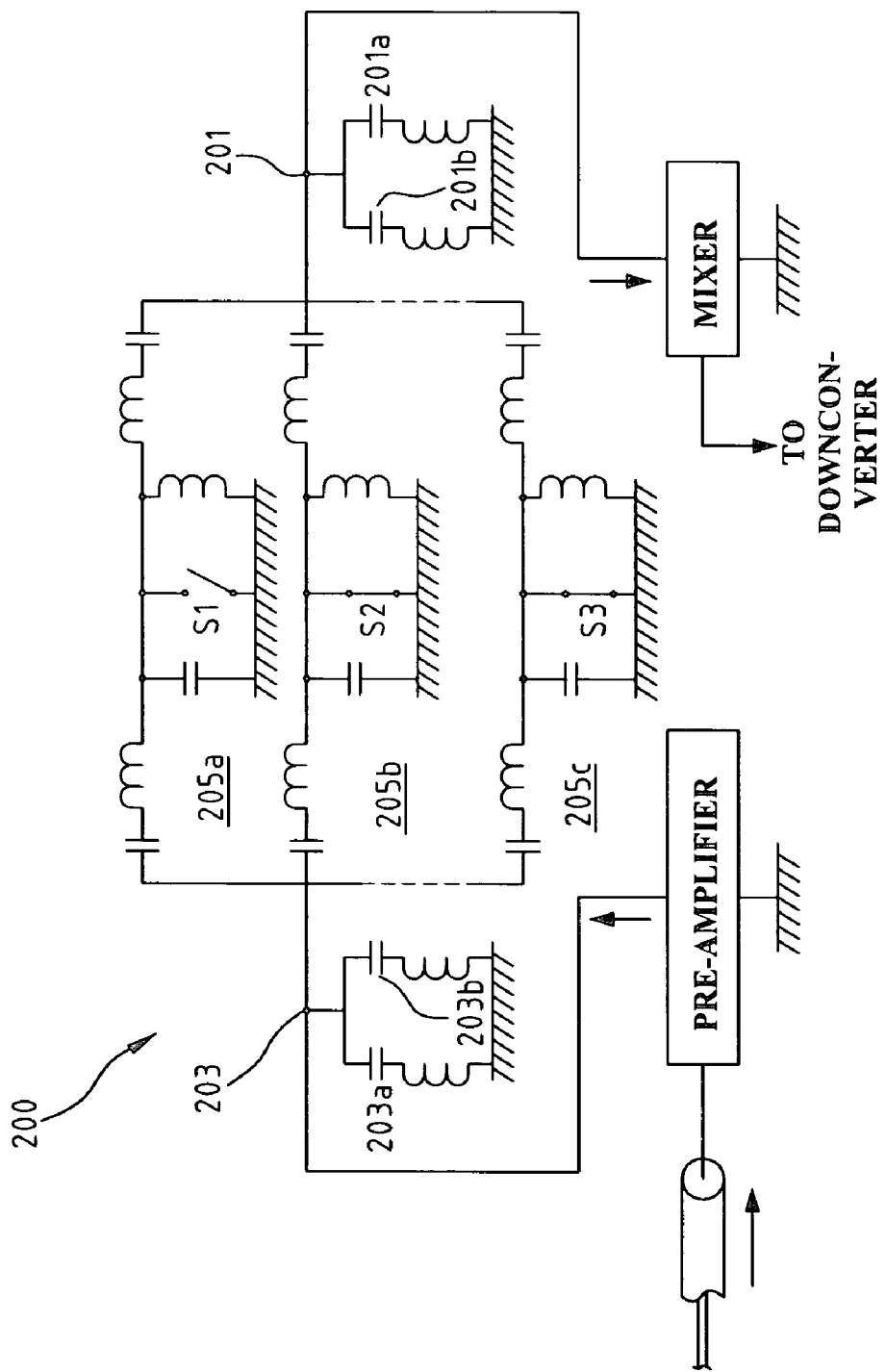
FIG. 2 shows a schematic diagram of a prior-art switchable filter circuit with an independent filter for each passband.
Figure 3:
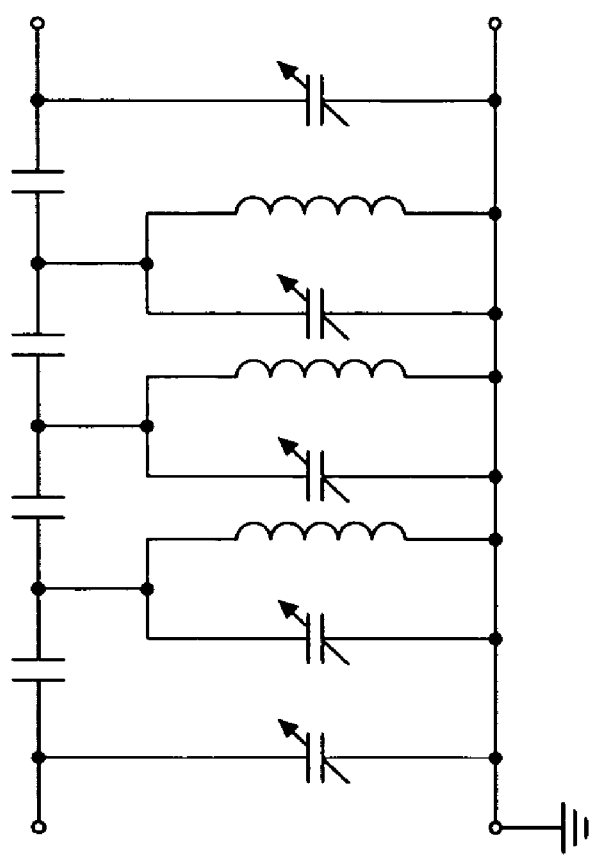
FIG. 3 shows a schematic diagram of a prior-art switchable filter circuit with a varactor embedded in each resonator element of the filter.
Figure 4:
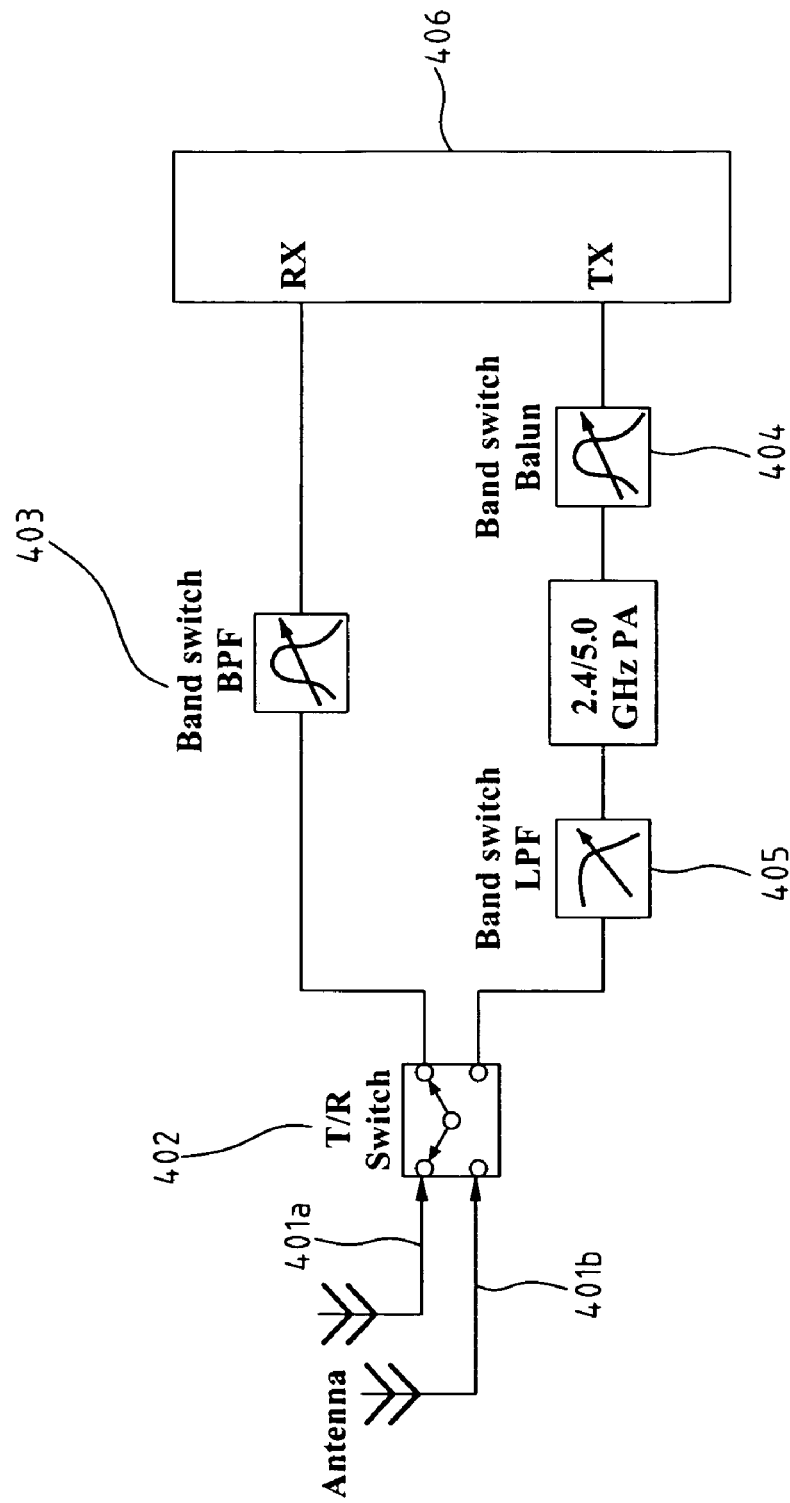
FIG. 4 shows a simplified block diagram of a switchable dual-band RF front-end circuit of the present invention.

FIG. 4 shows a simplified block diagram of a dual band RF front-end circuit according to a first embodiment of the present invention. Referring to FIG. 4, the dual band RF front-end circuit of the present invention includes two antennas, 401a corresponding to a first frequency and 401b corresponding to a second frequency, a band switch bandpass filter (BPF) 403, a band switch balun 404, a band switch low-pass filter (LPF) 405, a dual band receiver/transmitter switch 402 with two output terminals respectively connected to the band switch BPF 403 and the band switch LPF 405, and a dual-band/dual-mode transceiver chip 406 with a receiving terminal RX and a transmitting terminal TX. The receiving terminal RX is connected to the band switch BPF 403, while the transmitting terminal TX is connected to the band switch balun 404. The receiver/transmitter switch 402 is also connected to antennas 401a and 401b to determine which antenna is used to transmit or receive the signals of selected frequency. A power amplifier PA may be added between the band switch balun 404 and the LPF 405 to amplify the signals. The transceiver chip 406 is an RF integrated circuit (RFIC) having the transmitting terminal TX and the receiving terminal RX.

When antenna 401a or 401b receives signals, the received signals are passed to band switch BPF 403 for filtering. The filtered signals then reach the receiving terminal RX of transceiver chip 406 for processing. On the other hand, when signals are processed and ready for transmission, the signals are transmitted from the transmitting terminal TX of transceiver chip 406 to band switch balun 404, then band switch LPF 405, to reach antenna 401a or 401b for transmission. A power amplifier PA may be added between band switch balun 404 and LPF 405 to amplify the signals. Switch 402 is for switching the connection of antenna to respective circuit for receiving and transmission of signals.

Figure 5A:
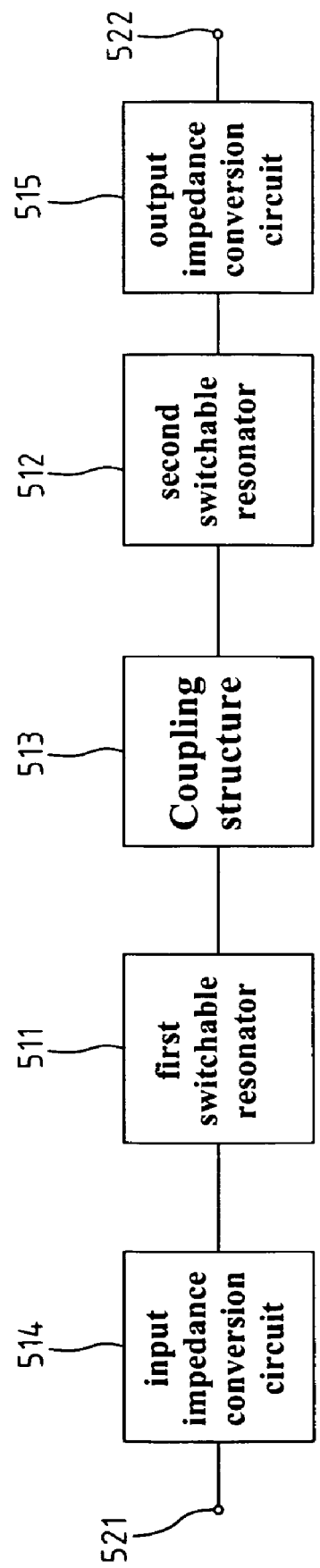
FIG. 5a shows a circuitry embodiment of the dual-band switchable filter according to the present invention.

FIG. 5a shows a circuitry embodiment of the dual-band switchable filter according to the present invention. Referring to FIG. 5a, the dual-band switchable filter 500 comprises a first and a second frequency switchable resonators 511, 512, a coupling structure 513 having two ends respectively connecting the first and the second frequency switchable resonators, an input impedance conversion circuit 514 connecting an input terminal 521 and the first resonator 511, and an output impedance conversion circuit 515 connecting an output terminal 522 and the second resonator 512.

The coupling structure 513 is to couple the first resonator 511 to the second resonator 512, and vice versa. The input impedance conversion circuit 514 converts the impedance on the input terminal 521 into two distinct impedances that correspond to a first and a second operating frequency, respectively. The output impedance conversion circuit 515 converts the impedance on the output terminal 522 into two distinct impedances that correspond to a first and a second operating frequency, respectively. According to the present invention, the coupling structure may be an inductor element. Each impedance conversion circuit may be a lumped network with two sections connected in series.

Figure 5B:
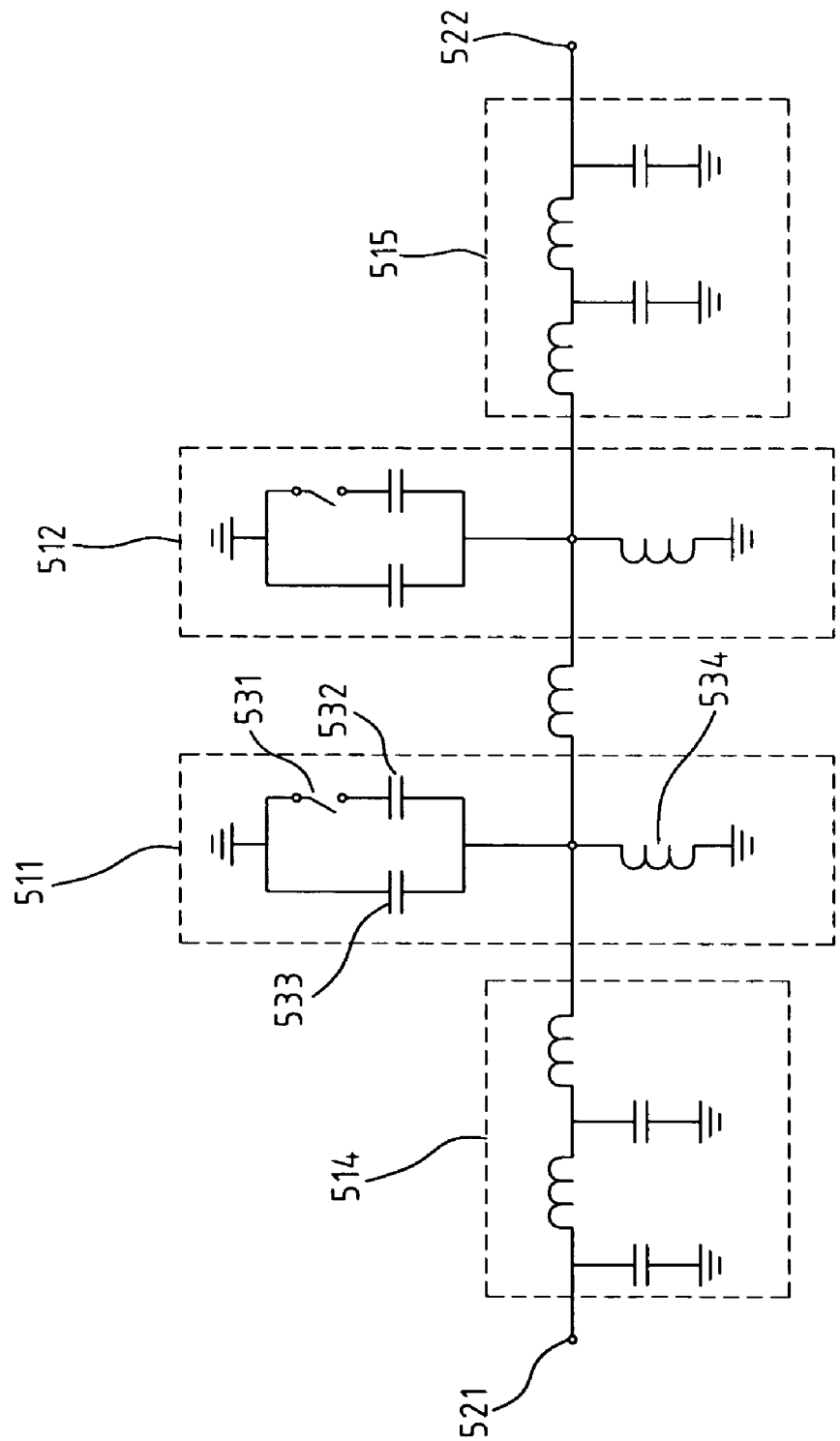
FIG. 5b illustrates a working example of the resonators incorporating the other elements of the dual-band switchable filter in FIG. 5a according to the present invention.

FIG. 5b illustrates a working example of the resonators 511, 512 incorporating the other elements of the dual-band switchable filter in FIG. 5a. Referring to FIG. 5b, each frequency switchable resonator, say resonator 511, further includes a grounded switch 531, two capacitors 532, 533 having capacitances C1, C2, respectively, and an inductor 534. The ground switch 531 is connected in series with capacitor 532; then the series is connected in parallel with capacitor 533. The inductor 534 is grounded at one end and the other end is connected to capacitors 532, 533. The grounded switch 531 is controlled by an external voltage for switching on and off. When the grounded switch 531 is on, it is equivalent to a resistor $R_{on}$ connected in series with an inductor $L_{on}$. The equivalent conductance of capacitors 532, 533 and switch is computed as:

$$Y_{eq} \equiv \frac{SC_1 + SC_2(SC_1(R_{on} + SL_{on}) + 1)}{SC_1(R_{on} + SL_{on}) + 1},$$

where S equals to jω. The equivalent conductance and inductor 534 resonate at a first frequency $f_1$.

On the other hand, when the grounded switch 531 is off, it is equivalent to a capacitor $C_{off}$, and the equivalent conductance of capacitors 532, 533 and switch is computed as:

$$Y_{eq} = SC_2 + \frac{S^2 C_1 C_{off}}{SC_{off} + SC_1}$$

The equivalent conductance and inductor 534 resonate at a second frequency $f_2$. According to the present invention, the grounded switch 531 may be a pin diode or a transistor.

After accurately computing the equivalent circuit parameters $R_{on}$, $L_{on}$, $C_{off}$, first resonant frequency $f_1$ and second resonant frequency $f_2$ can be controlled by selecting suitable capacitances $C_1$ and $C_2$.

Impedance conversion circuits 514, 515 are for converting the characteristic impedance of the input/output terminals, for example 50Ω, to the values $R_1$ and $R_2$, respectively, when first resonant frequency $f_1$ and second resonate frequency $f_2$ correspond to the slope parameters $b_1$ and $b_2$ of the resonator. For good impedance matching at both resonant frequencies, the relation between $b_1$, $b_2$, $R_1$, and $R_2$ must satisfy the following equation:

$$\frac{b_1}{R_1} = \frac{b_2}{R_2}$$

Figure 6:
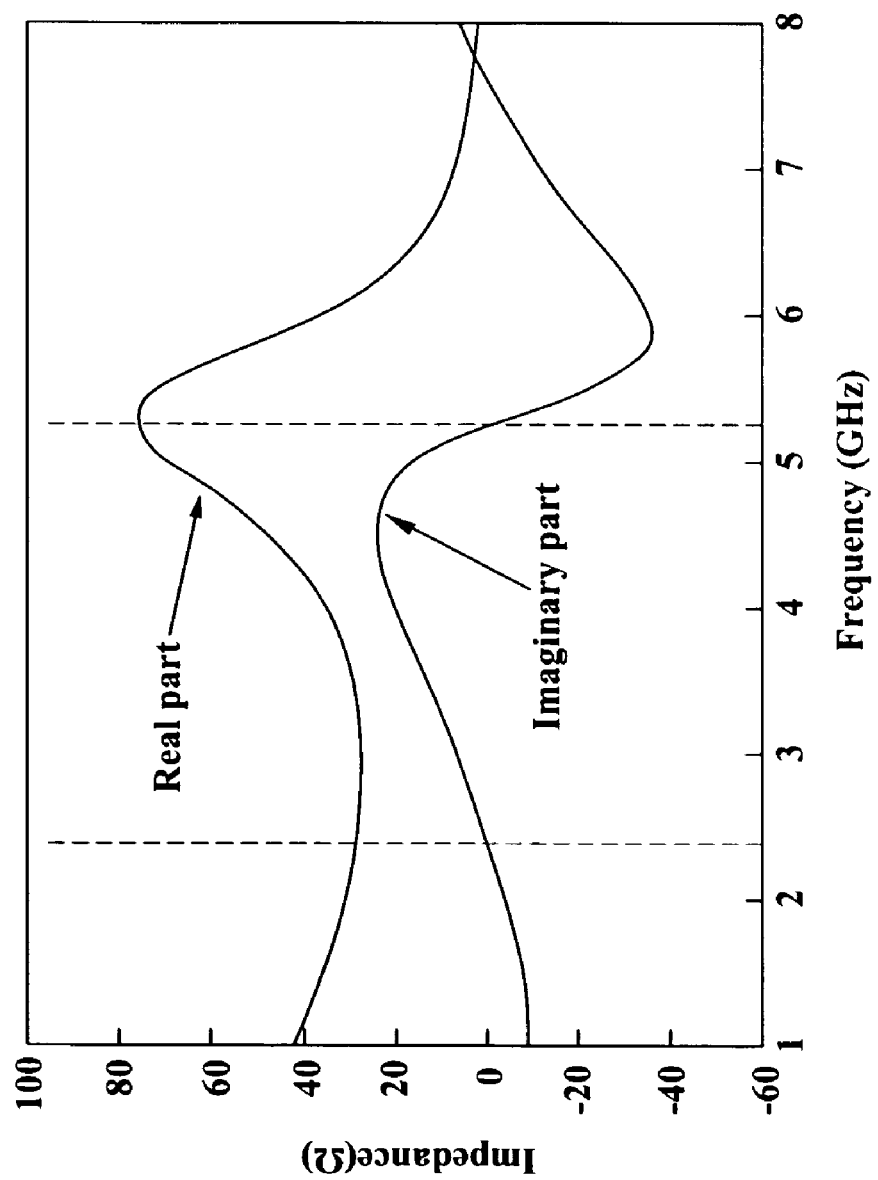
FIG. 6 shows a response relationship between the frequency and the impedance for a working example of the impedance conversion circuits.

FIG. 6 shows a response relationship between the frequency and the impedance for a working example of impedance conversion circuits 514 and 515. As shown in FIG. 6, the impedance from the resonator towards the input terminal or the output terminal is 30Ω at 2.4 GHz, and 75Ω at 5.2 GHz, respectively. It can be seen from FIG. 6 that at both frequencies 2.4 GHz and 5.2 GHZ, the imaginary part of the impedance has zero value. In other words, the impedance at both frequencies becomes purely resistive with only real part.

Figure 7:
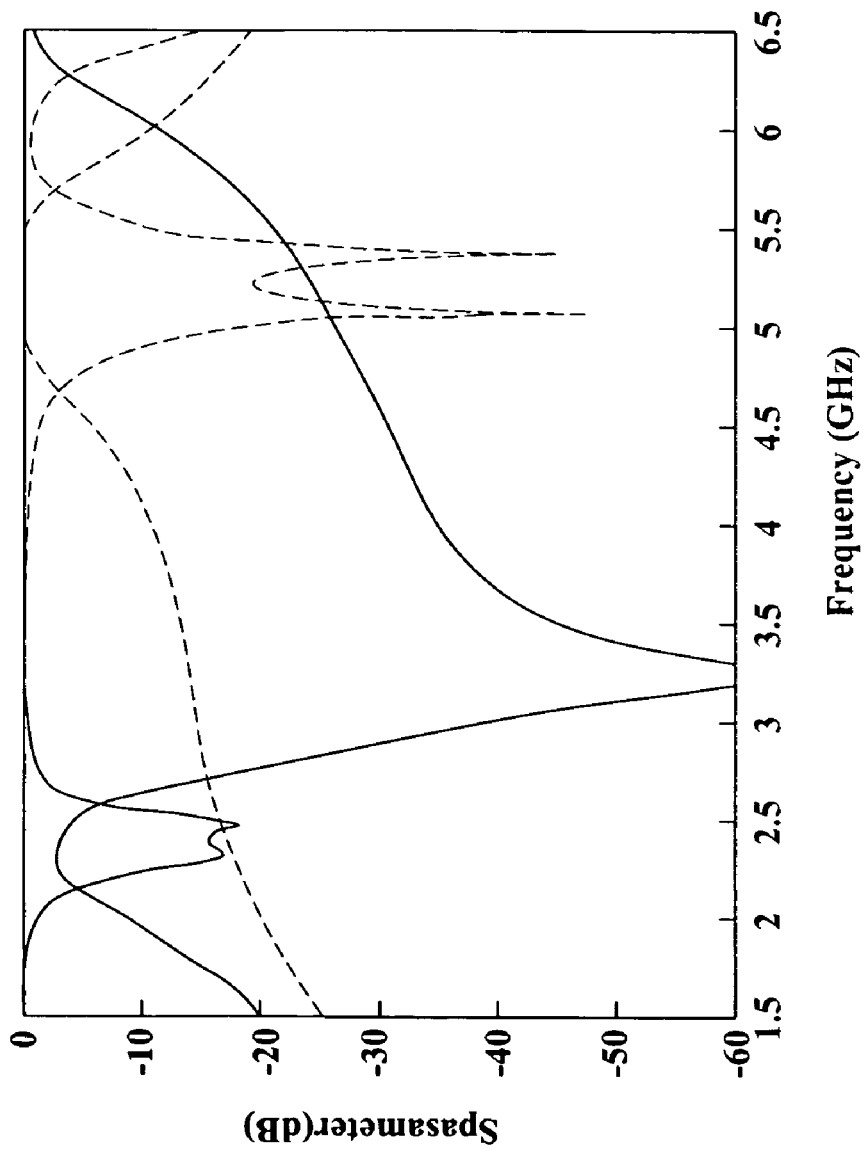
FIG. 7 shows the simulated response of the switchable dual-band filter according to the present invention.

FIG. 7 shows a simulated response of the switchable filter according to the present invention. When the grounded switch in the resonator is on, the switchable filter has a second-order bandpass response at 2.4 GHz. When the switch is off, the switchable filter has a second-order bandpass response at 5.2 GHz. As shown in FIG. 7, the switchable filter has a good impedance matching at both switched passbands.

Figure 8:
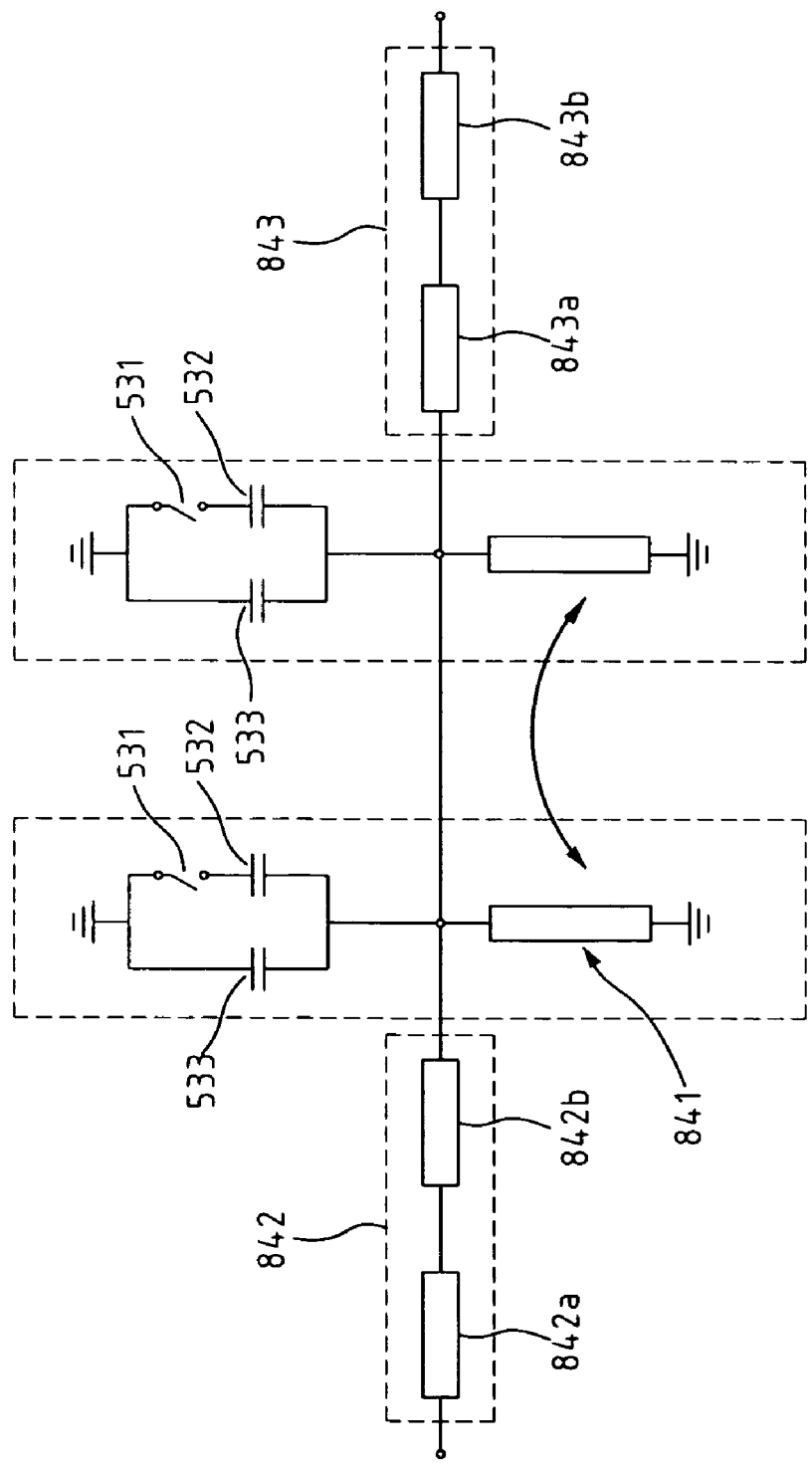
FIG. 8 shows another embodiment circuit of the dual-band filter illustrated in FIG. 4.

FIG. 8 shows another working example of a dual-band switchable filter that is applicable to a multi-layered circuit board. The circuitry structure in FIG. 8 is similar to the circuitry structure in FIG. 5 with only a few exceptions. The inductor 534 of FIG. 5b is replaced by a transmission line 841. Each impedance conversion circuit 514 or 515, say 514, of FIG. 5b is replaced by a first transmission line 842 with two sections 842a, 842b connected in series. The two sections 842a, 842b correspond to the first characteristic impedance and the first electrical length, and to the second characteristic impedance and the second electrical length, respectively. Similarly, the impedance conversion circuit 515 is replaced by a second transmission line 843 with two sections 843a, 843b connected in series.

In FIG. 8, the coupling structure 513 is electromagnetically coupled between the first and the second transmission lines 842 and 843. Each transmission line can be implemented on a dielectric substrate with a strip line or a microstrip line.

In comparison with the conventional designs, the present invention provides a dual-band switchable filter that is simple in structure, occupies a smaller circuit area, and is cost-effective for manufacturing. The impedance at both operating passbands can also be matched properly. In addition, the present invention can be implemented with lumped elements or distributed transmission lines so that it can be manufactured as an IC or a multi-layered circuit board.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A switchable dual-band filter for passing a first passband corresponding to a first frequency, and a second passband corresponding to a second frequency, said switchable dual-band filter comprising:
    first and second switchable resonators;
    a coupling structure having two ends respectively connecting said first and said second switchable resonators, and coupling said first resonator to said second resonator;
    an input impedance conversion circuit connecting an input terminal and said first resonator, and converting the impedance on said input terminal into two distinct impedances that correspond to said first and said second operating frequencies; and
    an output impedance conversion circuit connecting an output terminal and said second resonator, and converting the impedance on said output terminal into two distinct impedances that correspond to said first and said second operating frequencies;
    wherein each said impedance conversion circuit converts 50Ω terminal impedance into two resistive impedances at said first and said second operating frequencies.

2. The switchable dual-band filter as claimed in claim 1, wherein said coupling structure is an inductor element.

3. The switchable dual-band filter as claimed in claim 1, wherein each said impedance conversion circuit is a lumped network with two L sections connected in series.

4. The switchable dual-band filter as claimed in claim 3, wherein each L section consists of only a respective inductor connected to a corresponding capacitor, and the respective capacitor has one end connected directly to ground.

5. The switchable dual-band filter as claimed in claim 1, wherein each said resonator further includes a grounded switch, first and second capacitors having first and second capacitances respectively, and an inductor, said ground switch is connected in series with said first capacitor, then said ground switch and said first capacitor are connected in parallel with said second capacitor, said inductor is grounded at one end and the other end is connected to said first and second capacitors, and said ground switch is controlled by an external voltage for switching on and off.

6. The switchable dual-band filter as claimed in claim 5, wherein said grounded switch is a pin diode.

7. The switchable dual-band filter as claimed in claim 5, wherein said grounded switch is a transistor.

8. The switchable dual-band filter as claimed in claim 1, wherein said coupling structure is a transmission line, and each said impedance conversion circuit is a transmission line with two sections connected in series.

9. The switchable dual-band filter as claimed in claim 8, wherein each said section corresponds to a respective characteristic impedance and a corresponding electrical length.

10. The switchable dual-band filter as claimed in claim 8, wherein said coupling structure is electromagnetically coupling between two transmission lines.

11. The switchable dual-band filter as claimed in claim 8, wherein each said transmission line is implemented on a dielectric substrate with a strip line or microstrip line.

12. The switchable dual-band filter as claimed in claim 1, wherein said filter is manufactured as an integrated circuit.

13. The switchable dual-band filter as claimed in claim 1, wherein said filter is manufactured as a multi-layered circuit board.

* * * * *